(12) United States Patent
Oguro

(10) Patent No.: US 11,773,501 B2
(45) Date of Patent: Oct. 3, 2023

(54) METHOD FOR PRODUCING ELECTROLYTIC COPPER FOIL

(71) Applicant: TEX TECHNOLOGY INC., Tokyo (JP)

(72) Inventor: Ryoichi Oguro, Tokyo (JP)

(73) Assignee: TEX TECHNOLOGY INC., Tokyo (JP)

( * ) Notice: Subject to any disclaimer, the term of this patent is extended or adjusted under 35 U.S.C. 154(b) by 0 days.

(21) Appl. No.: 17/052,355

(22) PCT Filed: Jun. 3, 2020

(86) PCT No.: PCT/JP2020/021928
§ 371 (c)(1),
(2) Date: Nov. 2, 2020

(87) PCT Pub. No.: WO2021/014778
PCT Pub. Date: Jan. 28, 2021

(65) Prior Publication Data
US 2021/0317590 A1  Oct. 14, 2021

(30) Foreign Application Priority Data
Jul. 22, 2019  (JP) .................................. 2019-134775

(51) Int. Cl.
*C25D 3/38* (2006.01)
*C25D 17/10* (2006.01)
(Continued)

(52) U.S. Cl.
CPC ............... *C25D 3/38* (2013.01); *C25D 17/10* (2013.01); *H05K 1/03* (2013.01); *H01M 4/661* (2013.01); *H05K 2201/0355* (2013.01)

(58) Field of Classification Search
None
See application file for complete search history.

(56) References Cited

U.S. PATENT DOCUMENTS

2006/0210823 A1*  9/2006  Sano ........................ C25D 3/38
                                                          428/606
2009/0095515 A1     4/2009  Sakai et al.

FOREIGN PATENT DOCUMENTS

CN          102168289          8/2011
CN          102965699          3/2013
(Continued)

OTHER PUBLICATIONS

English translation of KR2018100939 (Year: 2018).*
(Continued)

*Primary Examiner* — Stefanie S Wittenberg
(74) *Attorney, Agent, or Firm* — Hamre, Schumann, Mueller & Larson, P.C.

(57) ABSTRACT

The present invention relates to a method for producing an electrolytic copper foil, the method enabling providing an electrolytic copper foil such that the electrical conductivity is 99% or more, the thickness is 10 μm or less, a problem of a bend is suppressed, the front side and the rear side are flat, the tensile strength is 500 MPa or more, and the elongation percentage is 5.5% or more. The method for producing an electrolytic copper foil includes forming an electrolytic copper foil by using, as an electrolytic solution, a sulfuric acid-copper sulfate aqueous solution not containing a heavy metal other than a copper metal, using an insoluble anode and a cathode drum facing the insoluble anode, and passing a direct current between these electrodes, wherein, in the electrolytic solution, particular additives (A) to (E) are contained each in a particular amount, and the additive (D) and the additive (A) are each added in a ratio such that (D)/(A) is 0.2 to 0.7.

8 Claims, 1 Drawing Sheet

(51) Int. Cl.
  *H05K 1/03* (2006.01)
  *H01M 4/66* (2006.01)

(56) References Cited

FOREIGN PATENT DOCUMENTS

| | | | | | |
|---|---|---|---|---|---|
| CN | 102965699 | * | 6/2015 | ............... | C25D 3/38 |
| CN | 104903495 | | 9/2015 | | |
| CN | 104903495 | * | 12/2016 | ............... | C25D 1/04 |
| JP | 2001-123290 | | 5/2001 | | |
| JP | 2006-351677 | | 12/2006 | | |
| JP | 2008-101267 | | 5/2008 | | |
| JP | 2011-174146 | | 9/2011 | | |
| JP | 2011174146 | * | 9/2011 | ............... | C25D 1/04 |
| JP | 2013-028848 | | 2/2013 | | |
| JP | 2016-125120 | | 7/2016 | | |
| JP | 2019-090107 | | 6/2019 | | |
| WO | 2011/129633 | | 10/2011 | | |
| WO | 2014/115681 | | 7/2014 | | |

OTHER PUBLICATIONS

International Search Report, issued in the corresponding PCT application No. PCT/JP2020/021928, dated Aug. 4, 2020, 3 pages.
Japanese Office Action, issued in the corresponding Japanese patent application No. 2019-134775, dated Nov. 26, 2019, 12 pages (including machine translation).
First Chinese Office Action, issued in the corresponding Chinese patent application No. 202080003927, dated May 18, 2021, 13 pages (machine translation enclosed).

* cited by examiner

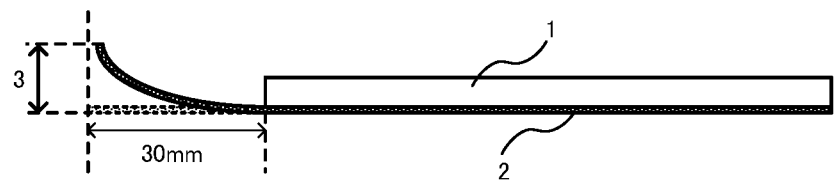

METHOD FOR PRODUCING ELECTROLYTIC COPPER FOIL

TECHNICAL FIELD

The present invention relates to a method for producing an electrolytic copper foil. The present invention relates to a technique for providing an electrolytic copper foil: which is useful as, for example, a negative electrode material for a secondary battery or a material for an electronic circuit board; which exhibits an electrical conductivity of 99% or more; which achieves both a high tensile strength of 500 MPa or more and a high elongation percentage of 5.5% or more although the electrolytic copper foil is thin, as thin as 10 µm or less; in which a rough surface is a flat surface having a low surface roughness; and which has an extremely high practical value.

BACKGROUND ART

As is well known, an electrolytic copper foil is produced by a method as follows, to which a plating technique is applied. An aqueous solution composed of sulfuric acid and copper sulfate is used as an electrolytic solution; this electrolytic solution is filled between a cylindrically shaped titanium drum which is a cathode and an insoluble anode which is an anode; a direct current is passed between both electrodes, and thereby copper is deposited on the cathode surface and a copper foil is formed. On this occasion, the cathode drum is rotating at a constant speed, and the deposited electrolytic copper is peeled from the drum surface to be wound continuously at a stage where the deposited electrolytic copper has a particular thickness. Therefore, a property of the "elongation percentage" which enables winding onto a drum in a satisfactory state is required in an electrolytic copper foil as a request for production. Among those skilled in the art herein, a surface of the peeled copper foil which was in contact with the drum is referred to as a "glossy surface", and a surface which is opposite to this glossy surface and is on the side of the electrolytic solution is referred to a "rough surface", and the electrolytic copper foil at this stage is referred to as an "untreated electrolytic copper foil".

For example, when an electrolytic copper foil is used for an electronic circuit board, various surface treatments for the purpose of improving adhesiveness with a resin, and imparting chemical resistance and rust preventiveness, and for other purposes are performed on the untreated electrolytic copper foil. Among those skilled in the art, the electrolytic coper foil which has gone through various surface treatment steps is referred to as a "treated electrolytic copper foil" in contrast with the above-described untreated electrolytic copper foil.

In recent years, the range of applying an electronic circuit board, which is the main application of the electrolytic copper foil, has become extremely wide, and utilization of the electronic circuit board has also become diversified. Further, demand in an automobile application in addition to a conventional mobile device application has been expanding with respect to a lithium ion secondary battery, and development of a technique corresponding to utilization as a negative electrode material for a secondary battery is also required in the electrolytic copper foil. For example, in a copper foil as a negative electrode collector, high tensile strength that is bearable against strong stress due to expansion and contraction of an electrode material is required, and retaining the high tensile strength even after the elapse of time is required. Under such circumstances, various studies according to applications have been conducted on the "treated electrolytic copper foil". In addition, it can be said that the "untreated electrolytic copper foil" which is a basic material for the treated electrolytic copper foil is more important, and therefore various proposals on the "untreated electrolytic copper foil" have also been made.

Among others, various attempts of devising an electrolytic solution for use in electrolysis at the time when the "untreated electrolytic copper foil" is produced have been made. For example, Patent Literature 1 proposes a technique for producing an electrolytic copper alloy foil containing tungsten and the balance composed of copper by electrolytic deposition, wherein a thiourea-based compound, a tungsten salt, and a chloride ion are added to a sulfuric acid-copper sulfate electrolytic solution. It is described that according to this technique, an electrolytic copper alloy foil having an electrolytic deposition surface which has a low profile, having large mechanical strength, and having mechanical strength which is less likely to be changed even if it is heated at 300° C. or higher is obtained. It is to be noted that the thickness of the tungsten-containing untreated electrolytic copper foil which is obtained in Examples in Patent Literature 1 is 12 µm.

In addition, Patent Literature 2 proposes that a problem of rough roughness resulting in occurrence of peeling of tin plating, caused by formation of crest and trough shapes on a surface on the side of the "rough surface" in the previously described "untreated electrolytic copper foil, is solved by ameliorating an electrolytic solution. Specifically, it is described that when a nonionic water-soluble polymer, a sulfonate salt of an active organic sulfur compound, a thiourea-based compound, and a chlorine ion are allowed to coexist in an electrolytic solution containing a sulfuric acid-copper sulfate aqueous solution, a resultant electrolytic copper foil is thereby made satisfactory as described below. That is, it is described that the resultant electrolytic copper foil is made such that it exhibits a low rough surface having a roughness of the rough surface of 2 µm or less, a particular crystal structure which is ascertained through observation on the rough surface side by X-ray diffraction, and a high tensile strength, as high as a tensile strength of 500 MPa or more after heating at 180° C. for 1 hour. It is to be noted that the untreated electrolytic copper electrode which is described to be obtained in Examples in Patent Literature 2 has a thickness of 18 µm.

The technique described in Patent Literature 3 intends to provide a copper foil having useful properties as a copper foil for a high-frequency circuit. In this technique, the state of a granular crystal structure on the surface of an untreated electrolytic copper foil is controlled by controlling the foil production condition for a copper foil, and, further, the surface is subjected to electrolytic etching, thereby enabling production of a copper foil having an excellent transmission loss in a high-frequency region and having high peel strength. It is described as exemplification that an electrolytic copper foil produced with a copper plating solution to which a compound having a mercapto group, a chloride ion, and a low-molecular-weight glue having a molecular weight of 10000 or lower or/and a macromolecular polysaccharide are added has a granular crystal structure. In the technique described in Patent Literature 3, it is described that having properties of a tensile strength of 20 $kN/m^2$ or more and an elongation percentage of 3% or more is desirable because of handling properties in a line. In addition, Patent Literature 3 relates to a technique based on the presupposition that electrolytic etching is performed on the surface of an untreated electrolytic copper foil later, and therefore the thickness of an untreated electrolytic copper foil which is obtained in Examples is 12 μm.

CITATION LIST

Patent Literature

Patent Literature 1: Japanese Patent Laid-Open No. 2013-28848
Patent Literature 2: Japanese Patent Laid-Open No. 2011-174146
Patent Literature 3: Japanese Patent Laid-Open No. 2006-351677

SUMMARY OF INVENTION

Technical Problem

However, the above-described conventional techniques have problems as described below. Firstly, the technique described in Patent Literature 1 is for obtaining a tungsten-containing untreated electrolytic copper foil (hereinafter, simply referred to as electrolytic copper foil), the copper foil contains a heavy metal other than copper, and therefore there is a fatal problem that the copper foil is inferior to pure copper foil in electrical conductivity even though the copper foil exhibits a high tensile strength of 500 MPa or more. In addition, the technique described in Patent Literature 2 intends to provide an electrolytic copper foil achieving that the roughness of the rough surface is 2.0 μm or less and the tensile strength after heating at 180° C. for 1 hour is 500 MPa or more, but as the required performance to the electrolytic copper foil of late, exhibiting higher tensile strength has been desired. With respect to the required performance, the thickness of the electrolytic copper foil given as an example in the technique described in Patent Literature 2 is thick, as thick as 18 μm, and therefore the technique is not the one that sufficiently meets a request of late for making an electrolytic copper foil light, thin, short, and small corresponding to reduction in size and weight of a product, reduction in material costs, and effective utilization of resources. Therefore, in an electrolytic copper foil having a thinner thickness of 10 μm or less, when an electrolytic copper foil product not only having high electrical conductivity but also having a rough surface which is flat, and exhibiting high tensile strength not only at the time of producing the foil but also after producing the foil is provided, the electric copper foil product is industrially extremely useful. It is to be noted that the technique of Patent Literature 3 is a technique for making the roughness of a rough surface 2.5 μm or less after an electrolytic etching treatment of an untreated electrolytic copper foil, and the object is different from the present invention and the other conventional techniques described above.

As mentioned previously, the thickness of any of the electrolytic copper foils which are described to be obtained by the conventional techniques is thick, as thick as 12 μm or more, but to meet the reduction in size and weight of a product of late, realization of high performance in a thinner electrolytic copper foil is desired. Also from the viewpoint of effective utilization of resources of late, a technique for providing an electrolytic copper foil having a thinner thickness and realizing excellent performance simply and economically has been hoped for.

According to studies conducted by the present inventors, it is difficult to enhance the mechanical strength in an electrolytic copper foil having a thinner thickness of 10 μm or less, and besides, an electrolytic copper foil the mechanical strength of which is enhanced has, on the other hand, a serious problem in production that elongation is impaired. In an electrolytic copper foil not having a sufficient elongation percentage, the foil is cut in some cases when an obtained electrolytic copper foil is wound onto a drum to be made into a product, and in that case, the yield of the product is drastically impaired. That is, the mechanical strength and elongation percentage in an electrolytic copper foil are in a trade-off relationship, and therefore it is industrially difficult to put the electrolytic copper foil having a thinner thickness of 10 μm or less into practical use unless a technique that can achieve both of the mechanical strength and the elongation percentage is provided.

In addition, according to studies conducted by the present inventors, when an electrolytic copper foil having a thin thickness of 10 μm or less is prepared by a conventional production method using a conventional electrolytic solution, the following problem exists, and this is also an industrially important technical problem in putting the electrolytic copper foil into practical use and needs to be solved. Specifically, the "bend (curl)" occurs to an electrolytical copper foil which is obtained by a conventional technique and has a thin thickness, and this "bend" is a cause for impairing a treatment efficiency in various surface treatments and the like whose objects are to improve the adhesiveness to a resin; to impart chemical resistance and rust preventiveness; and the like, the treatments performed later when the electrolytic copper foil is applied to various applications. Therefore, the workability in a treatment, the yield of an "electrolytic copper foil after performing various surface treatments thereon in order to provide it for customers", and the like have been impaired.

Further, according to studies conducted by the present inventors, even if an electrolytic copper foil which is obtained by a conventional technique and can exhibit satisfactory properties immediately after production can be made, the strength is lowered later, so that sufficiently high strength cannot stably be retained after the elapse of time, for example, after the elapse of 48 hours after production. This has been a problem in producing various products in which the electrolytic copper foil is utilized. Facing this problem, when an electrolytic copper foil also exhibits sufficiently high strength at a point in time when a treatment for obtaining the "treated electrolytic copper foil" needs to be performed after producing the foil, for example, 48 hours after producing the foil, not to mention that the electrolytic copper foil exhibits sufficient strength immediately after production, the electrolytic copper foil is a more advantageous material with respect to workability, processability, and the like as compared to conventional materials.

Accordingly, an object of the present invention is to develop a technique for providing an electrolytic copper foil: which has not been realized by conventional techniques; which can satisfactorily be wound onto a drum; which is excellent in workability and a yield; and which is extremely useful in practical use. Specifically, the object of the present invention is to develop a technique for providing an electrolytic copper foil which is a thin electrolytic copper foil having an electrical conductivity of 99% or more and having a thickness of 10 μm or less, and in which the problem of the "bend (curl)" is suppressed, the front side and the rear side are flat, as flat as having a surface roughness of 2.5 μm or less on both of the front side and the rear side, the tensile strength is 500 MPa or more, and the elongation percentage is 5.5% or more. Another object of the present invention is to produce an electrolytic copper foil exhibiting excellent performance described above and containing pure copper by a simple method in which additives in an electrolytic solution are merely devised without using a heavy metal separately and without putting another heavy metal into the crystal structure of the electrolytic copper foil.

Solution to Problem

The above-described objects can be solved by the present invention which has the following constitution and provides a method for producing an electrolytic copper foil, the method capable of producing an electrolytic copper foil simply.

[1] A method for producing an electrolytic copper foil, the method including forming an electrolytic copper foil by: using, as an electrolytic solution, a sulfuric acid-copper sulfate aqueous solution not containing a heavy metal other than a copper metal; using an insoluble anode having a surface of a substrate covered with at least one of a platinum group metal and/or an oxide thereof, and a cathode drum facing the insoluble anode; and passing a direct current between these electrodes, wherein
in the electrolytic solution, the following five types of additives of (A) to (E) are contained each in an amount described below, and the additive (D) and the additive (A) are each added in a ratio such that (D)/(A) is 0.2 to 0.7;
the additive (A): a soluble type or dispersible type nonionic organic compound having a molecular weight of 200000 to 500000 in an amount of 5 to 15 ppm;
the additive (B): a collagen peptide as a low-molecular-weight organic compound having a molecular weight of 7000 or lower in an amount of 6.5 to 15 ppm;
the additive (C): a sulfonate salt of an active organic sulfur compound in an amount of 2 to 10 ppm;
the additive (D): a thiourea-based compound in an amount of 2.5 to 15 ppm; and
the additive (E): a chlorine ion in an amount of 5 to 30 ppm.

Preferred embodiments of the method for producing an electrolytic copper foil of the present invention include the followings.

[2] The method for producing an electrolytic copper foil according to [1], wherein the additive (D) and the additive (A) are each added in a ratio such that (D)/(A) is 0.3 to 0.6.

[3] The method for producing an electrolytic copper foil according to [1] or [2], wherein the additive (A) contains at least any one selected from the group consisting of hydroxyethyl cellulose, polyglycerin, and acetylene glycol.

[4] The method for producing an electrolytic copper foil according to any one of [1] to [3], wherein the additive (C) contains sodium 3-mercapto-1-propanesulfonate or disodium bis(3-sulfopropyl)disulfide.

[5] The method for producing an electrolytic copper foil according to any one of [1] to [4], wherein the additive (D) is at least any one selected from the group consisting of thiourea, ethylene thiourea, N,N'-diethyl thiourea, N,N'-dibutyl thiourea, and trimethyl thiourea.

[6] The method for producing an electrolytic copper foil according to any one of [1] to [5], wherein the method is for obtaining an electrolytic copper foil such that lowering of tensile strength after producing the foil is suppressed, the electrolytic copper foil: having a tensile strength of 500 MPa or more immediately after producing the foil; and retaining a tensile strength of 500 MPa or more 48 hours after producing the foil.

[7] The method for producing an electrolytic copper foil according to any one of [1] to [6], wherein the method is for obtaining an electrolytic copper foil such that: an electrical conductivity is 99% or more (IACS value); a surface roughness Rz is 2.5 µm or less on both of a front side and a rear side; a thickness is 7 to 10 µm; and lowering of an elongation percentage is suppressed, and the elongation percentage is 5.5% or more.

[8] The method for producing an electrolytic copper foil according to any one of [1] to[7], wherein the electrolytic copper foil is for a negative electrode material for a secondary battery.

[9] The method for producing an electrolytic copper foil according to any one of [1] to [7], wherein the electrolytic copper foil is for a high-frequency circuit.

The object of the present invention can be achieved by the present invention which provides an electrolytic copper foil the constitution of which is as follows.

(1) An electrolytic copper foil obtained using an electrolytic solution not containing a heavy metal other than a copper metal, wherein:
a tensile strength is 500 MPa or more;
an electrical conductivity is 99% or more (IACS value);
a surface roughness is 2.5 µm or less on both of a front side and a rear side;
a thickness is 10 µm or less; and
an elongation percentage is 5.5% or more.

Preferred embodiments of the electrolytic copper foil include the followings.

(2) The electrolytic copper foil according to (1), wherein the surface roughness is 1.8 µm or less on both of the front side and the rear side.

(3) The electrolytic copper foil according to (1) or (2), wherein the tensile strength is 500 MPa or more in both of the electrolytic copper foil immediately after producing the foil and the electrolytic copper foil 48 hours after producing the foil.

(4) The electrolytic copper foil according to any one of (1) to (3), wherein the electrolytic copper foil is for a negative electrode material for a secondary battery.

(5) The electrolytic copper foil according to any one of (1) to (3), wherein the electrolytic copper foil is for a high-frequency circuit.

The present invention provides, as another embodiment, a method for producing an electrolytic copper foil, the method described below.

(6) A method for producing an electrolytic copper foil, the method being for obtaining the electrolytic copper foil according to any one of (1) to (5) and including forming the electrolytic copper foil by: using, as an electrolytic solution, a sulfuric acid-copper sulfate aqueous solution not containing a heavy metal other than a copper metal; using an insoluble anode having a surface of a substrate covered with at least one of a platinum group metal and/or an oxide thereof, and a cathode drum facing the insoluble anode; and passing a direct current between these electrodes, wherein
in the electrolytic solution, the following five types of additives of (A) to (E) are contained each in an amount described below, and the additive (D) and the additive (A) are each added in a ratio such that (D)/(A) is 0.2 to 0.7;
the additive (A): a soluble type or dispersible type nonionic organic compound having a molecular weight of 200000 to 500000 in an amount of 5 to 15 ppm;

the additive (B): a cyclic polyester oligomer as a low-molecular-weight organic compound having a molecular weight of 7000 or lower in an amount of 6.5 to 15 ppm;

the additive (C): a sulfonate salt of an active organic sulfur compound in an amount of 2 to 10 ppm;

the additive (D): a thiourea-based compound in an amount of 2.5 to 15 ppm; and the additive (E): a chlorine ion in an amount of 5 to 30 ppm.

Preferred embodiments of the above-described method for producing an electrolytic copper foil include the followings.

(7) The additive (D) and the additive (A) are each added in a ratio such that (D)/(A) is 0.3 to 0.6.

(8) The additive (A) contains at least any one selected from the group consisting of hydroxyethyl cellulose, polyglycerin, and acetylene glycol.

(9) The additive (C) contains sodium 3-mercapto-1-propanesulfonate or disodium bis(3-sulfopropyl)disulfide.

(10) The additive (D) contains at least any one selected from the group consisting of thiourea, ethylene thiourea, N,N'-diethyl thiourea, N,N'-dibutyl thiourea, and trimethyl thiourea.

Advantageous Effects of Invention

According to the present invention, an electrolytic copper foil product: which is a thin electrolytic copper foil having an electrical conductivity of 99% or more and having a thickness of 10 μm or less; and in which the problem of the "bend (curl)" is suppressed, both of the front side and the rear side are flat, as flat as having a surface roughness of 2.5 μm or less, the tensile strength is 500 MPa or more, and the elongation percentage is 5.5% or more can be provided. As a result, an electrolytic copper foil product: which has not been realized in conventional techniques; which is wound satisfactorily onto a drum; which is excellent in workability and a product yield; and which is extremely useful in practical use is provided. Moreover, according to the present invention, a material which is more advantageous with respect to workability and processability as compared to conventional materials, the material being such that an electrolytic copper foil exhibits sufficiently high strength not only immediately after production but also at a point in time when a treatment for obtaining the "treated electrolytic copper foil" needs to be performed after producing the electrolytic copper foil, for example, 48 hours after producing the electrolytic copper foil. Further, according to the present invention, a method for producing an electrolytic copper foil, by which an electrolytic copper foil which have not been realized by the conventional techniques and which has excellent properties can be obtained through a simple method in which additives in an electrolytic solution are merely devised, is provided, and therefore the method is extremely industrially useful. Furthermore, according to the production method of the present invention, an electrolytic copper foil having excellent properties which have never existed in the past is obtained although the number of types of additives to be used is small, on top of that, all the raw materials are general-purpose raw materials, and the use amounts thereof are smaller as compared to those in conventional methods, and therefore an electrolytic copper foil which is also useful in terms of economy and effective utilization of resources is provided.

BRIEF DESCRIPTION OF DRAWINGS

FIG. 1 is an explanatory drawing schematically showing a method for performing relative evaluation of a state of occurrence of a bend (curl) used for evaluating an electrolytic copper foil in the present invention.

DESCRIPTION OF EMBODIMENTS

Hereinafter, the present invention will be described in detail giving preferred embodiments. An electrolytic copper foil of the present invention is prepared using an electrolytic solution not containing a heavy metal other than a copper metal and is therefore basically composed of pure copper. For example, in Patent Literature 1, which is previously described as a conventional technique, a copper foil containing tungsten is made by electrolytic deposition, and therefore the electrical conductivity is lowered as compared to pure copper, so that a product having achieved an electrical conductivity of 99% or more is not made. This means that the copper foil which is provided by the technique of Patent Literature 1 has a serious problem that it is inferior in electrical conductivity which is basic performance that is extremely important in the application of a copper foil even if it is a suitable electrolytic copper foil in the strength thereof.

The electrolytic copper foil of the present invention is characterized by having a tensile strength of 500 MPa or more and having an elongation percentage of 5.5% or more although the electrolytic copper foil is thin, as thin as 10 μm or less. A copper foil is widely used as, for example, a printed wiring board in which the copper foil is pasted together with a polyimide film; however, improvements in the strength of a copper foil have been required because wiring integrated types have been increasing in recent years. On the other hand, from the viewpoint of the request for making a product light, thin, short, and small, the reduction in material costs, and the effective utilization of resources, a thinner copper foil is desired. Facing such present circumstances, the present invention realizes an electrolytic copper foil which has achieved both of high strength and a sufficient elongation percentage necessary for obtaining a product with a satisfactory yield in production although the electrolytic copper foil is an electrolytic copper foil having a thin thickness, as thin as a thickness of 10 μm or less, for example, 7 to 9 μm.

With respect to the electrolytic copper foil, the copper foil is formed by using an electrolytic solution containing copper, and passing a direct current between both electrodes, thereby depositing copper on a cylindrical drum of a cathode, and therefore a thin foil can be obtained more simply than in a method for obtaining a copper foil excellent in glossiness by rolling. However, in the case where the strength of an electrolytic copper foil having an electrical conductivity of 99% is enhanced by a conventional method, when the electrolytic copper is peeled from the cylindrical drum and is continuously wound to obtain an electrolytic copper foil product, a problem that a part of the copper foil is cut, and, in some cases, a problem that the copper foil is cut off in the middle of being wound occur unless the elongation percentage of the copper foil is sufficient. This means that satisfying both high tensile strength and a satisfactory elongation percentage is desired in an electrolytic copper foil. However, high tensile strength and a satisfactory elongation percentage are in a trade-off relationship, and it is extremely difficult to achieve both of them, and achieving both high strength and a satisfactory elongation percentage has not been realized yet in conventional techniques as described above.

In addition, there is a technical problem of occurrence of the "bend (curl)" in the case of an electrolytic copper foil obtained by a conventional technique and having a thin thickness, and the problem affects the treatment to be performed later; however, the electrolytic copper foil of the present invention is such that the occurrence of the "bend (curl)" is suppressed and has properties which have not existed in the past. Further, the electrolytic copper foil of the present invention is made such that the electrolytic copper foil exhibits high strength and a sufficient elongation percentage not only immediately after producing the foil but also even after the elapse of, for example, 48 hours after producing the foil in addition to suppression of the occurrence of the "bend (curl)". With respect to a conventional electrolytic copper foil, there was a tendency that the strength which is exhibited immediately after producing the foil is lowered at a point in time when, for example, a surface-treatment or the like is performed on the electrolytic copper foil to match any of the applications in various products although the conventional electrolytic copper foil exhibits satisfactory properties immediately after producing the foil. This together with the occurrence of the "bend (curl)" brings about a serious problem of impairing the workability, the processability, and the like in a technique for utilizing an electrolytic copper foil.

Moreover, as described previously, with respect to the electrolytic copper foil peeled and taken away from a cylindrical drum, the surface of the electrolytic copper foil, which was in contact with the drum, is flat as can be understood from the fact that the surface is referred to as the "glossy surface". However, the surface on the other side where the electrolytic copper foil is immersed in an electrolytic solution clearly has unevenness and has a larger roughness as compared to the "glossy" surface as can be understood from the fact that the surface is referred to as the "rough surface". Therefore, when an electrolytic copper foil product having a roughness of 2.5 µm or less on both the front side and the rear side in addition to having the previously described "thickness", "tensile strength", and "elongation percentage" which are specified in the present invention can be realized, the electrolytic copper foil is extremely useful as, for example, a base body copper foil for a negative electrode of a secondary battery, wherein being glossy surfaces are desired.

It is desired that the electrolytic copper foil which is provided in the present invention more preferably have a roughness of 2.0 µm or less, still more preferably 1.8 µm or less on both of the front side and the rear side. According to studies conducted by the present inventors, in an electrolytic copper foil obtained by an ordinary production method, the glossy surface exhibits a surface roughness of 1.0 µm or less. However, it is difficult to stably make the surface roughness of the rough surface 2.5 µm or less, further 2.0 µm or less, and it is difficult to stably obtain a product having a surface roughness of the rough surface of, more suitably, 1.8 µm or less.

The present inventors have conducted studies on realization of achieving both the high strength and the satisfactory elongation percentage, which are contrary to each other with respect to an electrolytic copper foil, in an electrolytic copper foil having a thin thickness of 10 µm or less, and, in addition to these requests, on simply obtaining an electrolytic copper foil stably having a surface roughness of the rough surface of 2.5 µm or less. The present inventors have conducted detailed studies particularly under the recognition that when all the problems are solved by devising the additives for an electrolytic solution for use in obtaining an electrolytic copper foil, an extremely useful technique is completed. First of all, the constitution of an electrolytic solution is made such that the constitution does not allow a heavy metal other than a copper metal to be contained in order to obtain an electrolytic copper foil having a high electrical conductivity of 99% or more. Therefore, the present invention is basically a technique for providing an electrolytic copper foil of pure copper. It is to be noted that the present invention does not deny even the existence of a heavy metal contaminating a copper foil by being inevitably contained in an electrolytic solution in a production process.

The heavy metal specified in the present invention means, for example, W (tungsten), which is proposed in the previously mentioned technique of Patent Literature 1. In this technique, tungsten, which is a metal other than copper, is mixed into an electrolytic solution to be co-deposited by electrolysis, so that "high strength is realized by intercalating the heavy metal in a copper foil", and therefore the technical feature is different from that in the present invention. More specifically, according to Patent Literature 1 whose constitution is as described above, the high tensile strength is realized in an electrolytic foil of "Cu—W" alloy. However, this technique can realize high tensile strength, but has fatal problems that the elongation percentage is small, and, among others, high electrical conductivity which a copper foil intrinsically has, is impaired.

The present inventors have conducted studies in order to obtain an industrially extremely useful electrolytic copper foil having properties which have not existed in the past by devising the additives for an electrolytic solution, not by intercalating another heavy metal in a copper foil to achieve high strengthening in a thin electrolytic copper foil having a thickness of 10 µm or less, as in the above-described technique. Specifically, the present inventors have conducted diligent studies in order to obtain an electrolytic copper foil which realizes high tensile strength, besides, exhibits a sufficient elongation percentage which is in a tradeoff relationship with the high tensile strength and is not inconvenient for producing the electrolytic copper foil, and further has a surface roughness of 2.5 µm or less on both of the front side and the rear side. It is desired that the roughness be more preferably 2.0 µm or less, and further, 1.8 µm or less on both of the front surface and the rear surface in the application, such as, for example, a base body copper foil for a negative electrode of a secondary battery, where the rough surface is desired to be a glossy surface. In the most preferred embodiment, both of the front side and the rear side ideally have the same roughness.

An electrolytic copper foil has a technical problem to be solved that, as mentioned previously, the "bend (curl)" occurs to an electrolytic copper foil obtained by a conventional technique and having a thin thickness, in addition to achieving the above-described properties. In addition, it is desired that the satisfactory strength of an electrolytic copper foil immediately after producing the foil be retained even after, for example, 48 hours after producing the foil taking an influence on the production of products for various applications utilizing the electrolytic copper foil into consideration. The present inventors have recognized that when an electrolytic copper foil by which these problems have been solved can be provided, the electrolytic copper foil is an industrially extremely useful material. With respect to the problem of the "bend (curl)" herein, it is said that the factor of the occurrence of the "bend (curl)" is in the residual stress in crystal grain boundaries and is also influenced by the crystal orientation during electrodeposition of copper. It is said that the crystal orientation which causes a large bend has an orientation of (2,2,0), and the crystal orientation which causes a small bend has an orientation of (1,1,1). In the conventional techniques, it is considered that an electrolytic copper foil having high strength particularly causes a large "bend (curl)".

The present inventors have found that an electrolytic copper foil which satisfies all the above-described properties can be realized by an extremely simple method such that the following five types of additives are each added in the amount specified in the present invention in a well-balanced manner to an electrolytic solution containing a sulfuric acid-copper sulfate aqueous solution, and have thereby reached the present invention. That is, the production method of the present invention is characterized in that in an electrolytic solution, the following five types of additives of (A) to (E) are contained each in a small amount in the range described below, and the additive (D) and the additive (A) are each added in a ratio such that (D)/(A) is 0.2 to 0.7. Hereinafter, these additives will be described.

Additive (A): a water-soluble or dispersible nonionic organic compound having a molecular weight of 200000 to 500000 in an amount of 5 to 15 ppm Additive (B): a cyclic polyester oligomer as a low-molecular-weight organic compound having a molecular weight of 7000 or lower in an amount of 6.5 to 15 ppm Additive (C): a sulfonate salt of an active organic sulfur compound in an amount of 2 to 10 ppm Additive (D): a thiourea-based compound in an amount of 2.5 to 15 ppm Additive (E): a chlorine ion in an amount of 5 to 30 ppm.

<Additive A>

In the present invention, a soluble type or dispersible type nonionic organic compound having a molecular weight of 200000 to 500000 is used as the additive (A) and is added in such a way that the concentration is 5 to 15 ppm in the electrolytic solution. Examples of such a water-soluble organic compound include hydroxyethyl cellulose, polyglycerin, and acetylene glycol. These compounds may appropriately be used together. For example, when hydroxyethyl cellulose is used, hydroxyethyl cellulose having a viscosity of 80 to 130/mPa·s, of 300 to 400/mPa·s, of 400 to 800/mPa·s, and the like at 2% and at 25° C. can suitably be used.

The reason that the excellent effects of the present invention are obtained by adding the additive (A) to the electrolytic solution is not certain, but the present inventors consider that the reason is as described below. The present inventors consider that the high-molecular-weight (A) component is dispersed when electrolysis acts thereon, thereby allowing copper crystals to grow, as a result, in the electrolytic copper foil of the present invention, the elongation percentage of the copper foil at normal temperature and at a high temperature can be improved, and further, high strength can be retained even after the elapse of 48 hours after producing the foil. In addition, according to studies conducted by the present inventors, when the addition amount is too large, there is a tendency that the appearance/shape (sometimes, referred to as M surface shape) of the rough surface of the electrolytic copper foil are deteriorated. Against this problem which is brought about when the addition amount of the additive (A) is large, the present inventors have found that the M surface shape (appearance) can be made better by using the electrolytic solution in which a chlorine ion is used together with the additive (A), as will be mentioned later. With respect to the reason that such an effect is obtained, the present inventors consider that the reason is as described below. It is inferred that the chlorine ion functions as a carrier that carries the other additive components effectively in an electrolytic solution in which electrolysis is being performed, and particularly when the addition amount of the high-molecular-weight additive (A) is large, the amount of the carrier is insufficient, and therefore adding a somewhat larger amount of the chlorine ion is effective.

In the present invention, it is important to perform electrolysis particularly using an electrolytic solution to which five types of the additives of (A) to (E) are added in a well-balanced manner, and with respect to the addition amount of the above-described additive (A), the additive (A) needs to be added in such a way that the concentration in the electrolytic solution is 5 to 15 ppm. More preferably, the additive (A) is added in a range such that the concentration is 5 ppm or more and less than 10 ppm.

<Additive B>

In the present invention, a cyclic polyester oligomer as a low-molecular-weight organic compound having a molecular weight of 7000 or lower is used as the additive (B) and is added in such a way that the concentration is 6.5 to 15 ppm in the electrolytic solution. Examples of a preferred additive (B) include a low-molecular-weight collagen peptide obtained by decomposing protein, the collagen peptide having a molecular weight of 7000 or lower and preferably 2000 or higher, for example, having a molecular weight of about 3000 to about 5000. The collagen peptide having the above-described molecular weight can be dissolved in the electrolytic solution stably and is easily available, and is therefore suitable for the present invention. The collagen peptide is obtained in such a way that gelatin obtained by subjecting collagen to heat denaturation is decomposed by an enzymatic treatment to lower the molecular weight to several hundreds to several thousands, has been attracting attention also as health food in recent years, and has been widely utilized as a raw material for cosmetics or a raw material for industrial use. As raw materials for collagen, animals, such as cattle and pigs, and, besides, fish skin and scales of flounders, salmons, and the like are used. Needless to say, the collagen peptide may be the one obtained by organic synthesis.

As the collagen peptide which is suitable as the additive (B) in the present invention and has a molecular weight of 7000 or lower, the one sold on the market can easily available. Examples of the collagen peptide derived from animal collagen include NIPPI PEPTIDE PBF and NIPPI PEPTIDE PRA (each manufactured by Nippi, Incorporated), SCP-5000, SCP-3100 (each manufactured by Nitta Gelatin Inc.), Collagen Peptide DS (manufactured by Kyowa Hi foods Co., Ltd.), and Pharconix CTP (manufactured by ICHIMARU PHARCOS Co., Ltd.). Besides such animal-derived collagen peptides, a substance having an amino acid composition similar to that in the animal collagen is preferable, and examples thereof include a peptide derived from a carrot as a peptide similar to collagen.

Collagen is a main protein that constitutes connective tissue of an animal and is contained abundantly in a bone, a tendon, skin, a vascular wall, and the like. Collagen has a one or a plurality of triple helical structures in a molecule, and various types of collagen each having a different amino acid sequence of a polypeptide chain that constitutes the collagen exist. Gelatin, which is a product of denaturation of collagen, is a water-soluble protein which is obtained by extracting a raw material containing collagen with hot (heated) water and has a molecular weight of 300000 to several tens of thousands.

In the present invention, the additive (B) is added in such a way that the concentration is 6.5 to 15 ppm in the electrolytic solution. The additive (B) is preferably added in such a way that the concentration is 7 to 12 ppm. According to studies conducted by the present inventors, it has been found that when an electrolytic copper foil is produced using an electrolytic solution to which a particular amount of this additive (B) is added, the M surface shape is made flat. The present inventors consider that the reason is that the additive (B), which is a low-molecular-weight component, is incorporated into the copper foil. In addition, when the addition amount is increased, it has been found that there is a tendency that the surface shape is made nonuniform although the value of the surface roughness is lowered. That is, it has been ascertained that irregularity or a streak is formed on the surface of the copper foil in some cases. Further, it has been found that to suppress this problem, addition of the chlorine ion is important also in this case like the case of the additive (A). Moreover, it has been ascertained that the additive (B), which is a low-molecular-weight component, does not affect the tensile strength and elongation of a resultant electrolytic copper foil regardless of whether the additive (B) is added to the electrolytic solution or not.

Further, according to studies conducted by the present inventors, it is important to use the additive (B) together with the additive (C), which will be mentioned later, in order to make the surface roughness of the surface of electrodeposition on the solution surface side of the electrolytic copper foil 2.5 μm or less, which is an object of the present invention. Furthermore, with respect to the proportion of these additives to be added, each of these additives is more preferably added in a ratio such that (C)/(B) is, for example, 0.2 to 0.6, still more preferably in a ratio such that (C)/(B) is about 0.2 to about 0.4.

<Additive (C)>

In the present invention, a sulfonate salt of an active organic sulfur compound is used as the additive (C) and is added in a range of 2 to 10 ppm in the electrolytic solution. The sulfonate salt of an active organic sulfur compound is preferably added in such a way that the amount is 2 to 6 ppm. Examples of the sulfonate salt of an active organic sulfur compound include sodium 3-mercapto-1-propanesulfonate and disodium bis(3-sulfopropyl)disulfide. The sulfonate salt of an active organic sulfur compound has conventionally been used as a gloss agent, decomposes quickly, and therefore is considered to quickly exhibit an effect of giving gloss and flat properties. One of the technical features of the present invention is in the finding that it is effective to use the previously described additive (B) together with the sulfonate salt of an active organic sulfur compound, which is used as a gloss agent, and further, on that occasion, the additive (B) and the sulfonate salt of an active organic compound are each used in a small addition amount specified in the present invention. In addition, one of the technical features of the present invention is in the finding that with respect to the proportion of the additives (B) and (C) to be added, by more preferably using the additive (B) and the additive (C) together in such a way that (C)/(B) is, for example, 0.2 to 0.6, the glossiness of the rough surface of a resultant electrolytic copper foil can optimally be controlled without affecting tensile strength and elongation.

As mentioned previously, the glossy surface of the electrolytic copper foil, formed by the surface of the drum by which the electrolytic copper foil was wound, has a surface roughness of 1.0 μm or less and is excellent in flatness, but it is difficult to stably make the surface roughness of the rough surface which is formed on the electrolytic solution side 2.5 μm or less, further 1.8 μm or less. Against this, when an electrolytic copper foil is produced by an ordinary method using the electrolytic solution having the constitution specified in the production method of the present invention, the surface roughness of the rough surface can stably be made 2.5 μm or less, suitably 1.8 μm or less. The method for producing an electrolytic copper foil will be mentioned later.

<Additive (D)>

In the present invention, a thiourea-based compound is used as the additive (D) and is added in a range of 2.5 to 15 ppm in the electrolytic solution. The concentration may appropriately be determined within this range according to required tensile strength. Examples of the thiourea-based compound for use in the present invention include thiourea, ethylene thiourea, N,N'-diethyl thiourea, N,N'-dibutyl thiourea, and trimethyl thiourea, and any of these can be used. Among others, thiourea is preferable.

The thiourea-based compound is a compound containing nitrogen, sulfur, and carbon in the structure thereof, and when these elements are incorporated into crystal boundaries of copper, the tensile strength of an electrolytic copper foil is enhanced as a result. However, according to studies conducted by the present inventors, the elongation is lost as much as the strength is enhanced, and a resultant electrolytic copper foil is easily fractured. In conventional techniques, the thiourea-based compound has been used in an electrolytic solution in such a way that it is added as a chemical agent for enhancing the strength of plating. However, according to studies conducted by the present inventors, the range of the addition amount to an electrolytic solution for the purpose of allowing the thiourea-based compound to function as a high-strength chemical agent is extremely narrow, and therefore there has been a problem that the thiourea-based compound is difficult to utilize in practical use. Facing this, the present inventors have found that when the addition amount of the thiourea-based compound is increased, the strength of a resultant electrolytic copper foil is improved, and when the addition amount is decreased, lowering of the strength is seen, and therefore the addition amount of the thiourea-based compound remarkably relates to the strength of an electrolytic copper foil.

The addition amount of the thiourea-based compound as the additive (D) is preferably 2.5 to 7.0 ppm, and further, the addition amount is still more preferably 2.5 to 5.0 ppm. As will be mentioned later, in the present invention, by using the thiourea-based compound together with the additive (A), high tensile strength and an elongation percentage which is sufficient for producing an electrolytic copper foil in a satisfactory state are achieved in such a small addition amount. The main technical feature of the present invention is in that a technique capable of achieving both of the mechanical strength and the elongation percentage, which are in a trade-off relationship in an electrolytic copper foil, at a higher level and in a more stable manner is provided by the constitution described below. Specifically, the thiourea-based compound which is the additive (D) for improving the strength, and the high-molecular-weight (A) component which is dispersed by being added to the electrolytic solution when electrolysis acts thereon, thereby allowing copper crystals to grow, and, as a result, can improve the elongation percentage of a copper foil at normal temperature and at a high temperature are used under the condition described below. That is, the additive (D) and the additive (A) are each added in a small addition amount within a particular range specified in the present invention and each added in a ratio such that (D)/(A) is 0.2 to 0.7. The present invention realizes providing an electrolytic copper foil in which both of the mechanical strength and the elongation percentage, which are in a trade-off relationship, have been achieved at a higher level and in a more stable manner by the simple constitution in which the electrolytic solution having novel constitution satisfying the above-described condition is used.

In addition, according to studies conducted by the present inventors, control of the sulfuric acid concentration and chlorine ion concentration, which will be mentioned later, in the electrolytic solution is important in order to more enhance the effect due to addition of the thiourea-based compound. Specifically, for example, the sulfuric acid concentration in the electrolytic solution is preferably set to 95 g/L or more, and the chlorine ion concentration is preferably set to 30 mg/L or less.

<Ratio of Additives to be Added, and so On>

The present inventors have conducted diligent studies on suppressing and solving the lowering of the elongation percentage of a copper foil, which occurs when the strength is enhanced by skillfully utilizing the effect of improving the strength of an electrolytic copper foil which is obtained by adding the thiourea-based compound, by the other additive components to be added to the electrolytic solution, and have thereby achieved the present invention. First of all, as described previously, the present inventors have found that the elongation of a copper foil at normal temperature and at a high temperature can be improved by adding the additive (A), and the state is retained even after the elapse of 48 hours after producing the foil. In addition, it has been found that, in that case, when the addition amount of the additive (A) is too large, the strength is lowered, and therefore, it is effective to add the additive (A) in a concentration range of 5 to 15 ppm, which is specified in the production method of the present invention, more preferably in a range such that the concentration is 5 ppm or more and less than 10 ppm.

Further, according to studies conducted by the present inventors, it has been found that by making the constitution as described below, a resultant electrolytic copper foil realizes excellent performance by which a more balanced effect is obtained in addition to the above-described effects, and which meets, in a well-balanced manner, any of various requirements in putting the electrolytic copper foil into practical use. Specifically, the constitution is preferably made such that the previously described additives (B) and (C), which are necessary to stably make the surface roughness of the rough surface 2.5 μm or less, are each used in a particular amount, and still more preferably, the additives (B) and (C) are each used in a particular proportion. That is, in the present invention, the effect of improving the strength of an electrolytic copper foil is obtained by adding the thiourea-based compound which is the additive (D) in a particular range, and the problem of lowering the elongation percentage of the copper foil, which occurs due to the addition of the additive (D), is suppressed by adding the high-molecular-weight organic compound which is the additive (A) in a particular range. Further, the problem of deteriorating the appearance/shape, such as irregularity and a streak which appears on the rough surface, due to the addition of the additive (A), is solved by the addition of the additives (B) and (C) the addition amounts thereof are controlled, thereby enabling realization of an electrolytic copper foil having all kinds of performance, which have not existed in the past and are specified in the presentation, in a well-balanced manner.

Specifically, the present inventors have found that the following constitution is important in order to obtain an electrolytic copper foil which has not been realized in the past, which has necessary performance in a well-balanced manner, and which is industrially extremely excellent, and have thereby completed the present invention. First of all, for realization, five types of additives of (A) to (E) need to be used each in a relatively small amount in a particular range as the additives to the electrolytic solution, the additives specified in the production method of the present invention. Further, the following requirements are important in order to achieve both of the mechanical strength and the elongation percentage, which have strongly been required as properties of an electrolytic copper foil in recent years but are difficult to achieve together, and which are in a trade-off relationship. Specifically, the electrolytic solution is prepared by adding the additive (D) and the additive (A) each in a ratio such that (D)/(A) is 0.2 to 0.7. More preferably, the additive (D) and the additive (A) are each used in a ratio such that (D)/(A) is 0.3 to 0.6. Further, the previously described additive (C) and additive (B) may each be added to the electrolytic solution in a ratio such that (C)/(B) is 0.2 to 0.6 within a range of each addition amount specified in the present invention in order to make the surface characteristics of the electrolytic copper foil satisfactory. More preferably, it is effective to add the additive (C) and the additive (B) each in a range where the ratio of (C)/(B) is 0.2 to 0.4.

<Additive E>

The chlorine ion concentration in the electrolytic solution is also important as mentioned previously in order to obtain the above-described electrolytic copper foil having excellent performance by the production method of the present invention, and specifically, the constitution is made such that the chlorine ion is contained as the additive (E) in a range of 5 to 30 ppm in the electrolytic solution. As mentioned previously, it is considered that the chlorine ion functions as a carrier that carries the additives effectively in the electrolytic solution. The chlorine ion may be added appropriately adjusting the concentration in a range of 5 to 30 ppm, more preferably 15 to 30 ppm particularly in view of balance with the addition amount of the high-molecular-weight organic compound which is the additive (A) and the addition amount of the thiourea-based compound which is the additive (D). It is to be noted that according to studies conducted by the present inventors, when the chlorine ion is added in an amount exceeding 30 ppm, a more remarkable effect of the chlorine ion is not recognized. As mentioned previously, the addition of the chlorine ion within the above-described range also contributes to the effect of suppressing the problem of deteriorating the appearance/shape, such as irregularity or a streak which appears on the rough surface. As a source of the chlorine ion, for example, hydrochloric acid may be used.

Further, in an electrolytic copper foil which is obtained by a conventional technique and has a thin thickness, the problem of the "bend (curl)" occurs, but, in contrast, surprisingly, in an electrolytic copper foil obtained by the production method of the present invention characterized in that the electrolytic solution having particular constitution described above is used, the occurrence of the "bend" is clearly suppressed. It has been ascertained that a thin electrolytic copper foil in which the problem of the bend has been solved and which has a thickness of 10 μm or less can be realized by the present invention. The "bend" which occurs in an electrolytic copper foil is a big problem in production when various products are efficiently prepared utilizing the electrolytic copper foil, and therefore the effects which are brought about by the "electrolytic copper foil in which the occurrence of the bend is stably suppressed" which is realized by the present invention are industrially extremely large. With respect to the reason that the effects are obtained by the constitution in which a particular electrolytic solution specified in the present invention is used, the present inventors consider the reason as described below. As mentioned previously, it is said that in a copper foil, the crystal orientation which causes a large bend has an orientation of (2,2,0), and the crystal orientation which causes a small bend has an orientation of (1,1,1). From this, it is considered that the crystal orientation of the "electrolytic copper foil in which the occurrence of the bend (curl) is suppressed", which has been realized by the present invention, has an orientation of (1,1,1). The present inventors infer that by using the electrolytic solution having novel constitution such that the additives (A) to (E) are each used in a smaller amount than those in conventional techniques in such a way as to make a particular combination, these additives give, in a complex manner, an influence on the crystal orientation of a copper foil to be formed to allow the crystal orientation of the electrolytic copper foil to have an orientation of (1,1,1). The present inventors consider that as a result, "the occurrence of the bend (curl)" can stably be suppressed.

<Electrolysis Method>

In the method for producing an electrolytic copper foil, electrolysis is performed by: using the electrolytic solution having particular constitution described above; using an insoluble anode having a surface of a substrate covered with at least one of a platinum group metal and/or an oxide thereof, and a cathode drum facing the insoluble anode; and passing a direct current between these electrodes. More specifically, the previously described additives (A) to (E) are added each in the range specified in the present invention to the electrolytic solution containing a sulfuric acid/copper sulfate aqueous solution to perform adjustment. Subsequently, this electrolytic solution is supplied between the insoluble anode covered with a platinum group oxide and the titanium cathode drum which is a cathode to perform electrolysis using a direct current under an electrolysis condition of an electrolytic solution temperature of 35 to 60° C. and an electrolysis current density of 20 to 80 A/dm$^2$. By such a simple method, an electrolytic copper foil which is an object of the present invention and exhibits well-balanced performance can be obtained.

It is to be noted that the electrolytic copper foil which is provided by the present invention can be used in a wide range as a material for a printed wiring board, the material having high tensile strength. According to the present invention, the strength and elongation of a resultant electrolytic copper foil can be controlled at an unprecedentedly high level by appropriately increasing or decreasing the combinations for an electrolytic solution in the ranges specified in the present invention. Therefore, the electrolytic copper foil which is provided by the present invention can be utilized in a wide range of applications as, for example, a negative electrode material for a secondary battery or as a material for a high-frequency circuit. Particularly, not only the strength of the electrolytic copper foil can be achieved after producing the foil, but also high strength is retained sufficiently even after the elapse of 48 hours after producing the foil, and therefore the strength of the electrolytic copper foil which is provided by the present invention is extremely useful when the above-described products are produced.

EXAMPLES

Hereinafter, the present invention will be described in more detail giving Examples and Comparative Examples.

Examples 1 to 8 and Comparative Examples 1 to 7

A sulfuric acid-copper sulfate aqueous solution composed of 100 g/L of sulfuric acid ($H_2SO_4$) and 280 g/L of copper sulfate pentahydrate ($CuSO_4 \cdot 5H_2O$) was prepared. Hereinafter, this electrolytic solution is referred to as a "base electrolytic solution".

The following components were each prepared as an additive to be added to the base electrolytic solution.

Additive (A): hydroxyethyl cellulose having a molecular weight of 250000, hydroxyethyl cellulose having a molecular weight of 500000 (each manufactured by Daicel Miraizu Ltd.), and polyglycerin (manufactured by Daicel Corporation; hereinafter, abbreviated as PGL)

Additive (B): a collagen peptide having a molecular weight of 5000 (manufactured by ASAHI GELATINE INDUSTRIAL Co., Ltd.)

Additive (C): sodium 3-mercapto-1-propanesulfonate (manufactured by Koei Chemical Co., Ltd.)

Additive (D): thiourea (manufactured by NIPPON CHEMICAL INDUSTRIAL CO., LTD.) and N,N-diethyl thiourea (hereinafter, abbreviated as EUR)

Additive (E): hydrochloric acid

The respective additives described above were added to and mixed with the base electrolytic solution in such a way as to adjust the concentration of each additive as shown in Table 1, thereby obtaining electrolytic solutions for use in Examples and Comparative Examples. Hydroxyethyl cellulose having a molecular weight of 250000 was basically used as the additive (A), and thiourea was basically used as the additive (D). In Comparative Example 7, polyglycerin (PGL) was used as the additive (A), and N,N-diethyl thiourea (EUR) was used as the additive (D). It is to be noted that hydroxyethyl cellulose having a molecular weight of 500000 which is the additive (A) was used for a test the purpose of which is to check whether the same results as those in the case where hydroxyethyl cellulose having a molecular weight of 250000 was used are obtained. The same results were obtained, and therefore are not described in the table. In Comparative Examples 5 and 6, sodium tungstate was used and contained in an amount of 100 ppm as tungsten in the electrolytic solution.

Each of the electrolytic solution obtained above was supplied between an insoluble anode composed of titanium covered with a platinum group oxide and a titanium cathode drum which is a cathode. Subsequently, electrolysis was performed under an electrolysis condition of an electrolysis current density: 40 A/dm$^2$ and an electrolytic solution temperature: 40° C., and a resultant electrolytic copper foil was wound on the drum according to an ordinary method to obtain electrolytic copper foils each having a thickness shown in Table 2.

The tests described below were performed for each of the obtained electrolytic copper foils of Examples and Comparative Examples to perform evaluation. Each evaluation was performed for the electrolytic copper foils after the elapse of 48 hours after producing the foil. This is because with respect to the strength of a conventional electrolytic copper foil, there was a tendency that the strength of the electrolytic copper foil immediately after producing the foil is large, but in the electrolytic copper foil after the elapse of 48 hours, on which a next treatment or the like is performed, the strength is lowered by about 25 to about 30%, and high strength cannot be retained. For reference, the tensile strength of the electrolytic copper foils immediately after producing the foils was also measured. Obtained evaluation results are shown together in Table 2.

(1) Tensile Strength

Measurement of the tensile strength (MPa) was performed based on IPC-TM-650 for each electrolytic copper foil using TENSILON Universal Material Testing Instrument manufactured by A&D Company, Limited. In addition, each electrolytic copper foil was retained in an environment of normal temperature/normal humidity, specifically in an environment of 25 to 35° C. and a humidity of 25 to 40% for 48 hours in order to evaluate the stability of the strength with time, and thereafter the measurement of the tensile strength of each electrolytic copper foil was performed. Obtained results are shown together in Table 2.

(2) Elongation Percentage

The elongation percentage (%) was measured based on IPC-TM-650 for each electrolytic copper foil using TENSILON Universal Material Testing Instrument manufactured by A&D Company, Limited. In addition, each electrolytic copper foil was retained in an environment of normal temperature/normal humidity, specifically in an environment of 25 to 35° C. and a humidity of 25 to 40% for 48 hours in order to evaluate the stability of the elongation percentage with time, and thereafter the measurement of the elongation percentage of each electrolytic copper foil was performed. Obtained results are shown together in Table 2.

(3) Electrical Conductivity

The electrical conductivity of the electrolytic copper foils was measured in accordance with JCBA T603 "Measuring method of Electrical Conductivity by Eddy Current Conductivity Meter", which is an operation standard of general incorporated association "Japan Copper and Brass Association". Results are shown in Table 2. The results are each expressed by a percentage of an electrical resistance value at 20° C. to that of standard soft copper (1.7241 sun & cm). Accordingly, the electrical conductivity of the electrolytic copper foils exceeds 100% in some cases.

(4) Evaluation of Roughness of Surface

With respect to the surface roughness of the rough surface (M surface) of each electrolytic copper foil, the ten-point average roughness (Rz) specified in JIS B0601 was measured. Obtained results are shown together in Table 2. It is to be noted that any of the electrolytic copper foils had a surface roughness of the glossy surface of 1.0 µm.

(5) Evaluation of Appearance of Rough Surface (M Surface) With respect to the surface characteristics of the rough surface, the M surface shape was visually observed to perform evaluation by the criteria of four stages described below. Obtained results are shown together as Gloss in Table 2.

Excellent: Irregularity and a streak are not recognized at all, and the surface is extremely flat and glossy.

Good: The surface is somewhat inferior in glossiness.

Fair: A streak does not exist, but irregularity is recognized, and the surface lacks glossiness.

Poor: The surface is not glossy, and irregularity and a streak are recognized.

(6) Evaluation of Occurrence of Bend (Curl)

The occurrence of the bend (curl) was evaluated by visually observing each sample for measuring a curl value, the sample having a size as described below, and the extent of the bend (curl) which occurred to each electrolytic copper foil was measured relatively and evaluated by the following method. Each electrolytic copper foil was cut out into a size of 25.2 mm×125 mm, and a resultant short belt-like electrolytic copper foil was used as a sample piece for measuring a bend (curl) value. As shown in FIG. 1, the sample piece was left to stand on a horizontal stand, and when a short side of 25.2 mm is defined as an end, the whole sample piece excluding a part of the sample piece, the part including positions within 30 mm from one end, was pressed with a flat plate 1. On that occasion, a value 3 which is measured as a bend (curl) at the end of a test piece 2 from the horizontal stand was defined as a curl value (mm) of the electrolytic copper foil. The occurrence of the bend (curl) was evaluated by the criteria of four stages described below. Obtained results are shown together in Table 2.

Excellent: The curl value is 0 to less than 5 mm. The bend is not recognized by visual observation.

Good: The curl value is 5 mm or more and less than 10 mm. The bend is somewhat recognized by visual observation.

Fair: The curl value is 10 mm or more and less than 15 mm. The bend is recognized by visual observation, but is at a practically usable level.

Poor: The curl value is 16 mm or more. The extent of the bend is clearly larger as compared to that of other samples.

(7) Evaluation of Occurrence of Break in Electrolytic Copper Foil

Each electrolytic copper foil was cut out into a size of 25.2 mm×100 mm, and a resultant short belt-like electrolytic copper foil was used as a sample piece for evaluating occurrence of a break. The sample piece was put on a horizontal stand, and when a short side of 25.2 mm is defined as an end, the sample piece was folded back to overlap both ends, and 200 g of a weight was put on the folded part. The weight was removed to return the folded sample piece to the original state. This operation was repeated until the sample piece was fractured, and evaluation of the occurrence of a break in the electrolytic copper foil was performed by the following criteria of four stages using the number of times of repetition until the sample piece was fractured. Obtained results are shown together in Table 2.

Excellent: The number of times of repetition is 11 or more. A risk of the occurrence of a break during producing the electrolytic copper foil is extremely low.

Good: The number of times of repetition is 6 or more and less than 11. A risk of the occurrence of a break during producing the electrolytic copper foil is low, which is an allowable extent in practical use.

Fair: The number of times of repetition is 2 or more and less than 6. There is a risk of the occurrence of a break from a drum edge during producing the electrolytic copper foil.

Poor: The number of times of repetition is 1 or more and less than 2. A risk of the occurrence of fracture in the copper foil during producing the electrolytic copper foil is extremely high.

TABLE 1

Constitution of additives in electrolytic solution

| Additive | (A) | (B) | (C) | (D) | (E) | (D)/(A) ratio |
|---|---|---|---|---|---|---|
| Example 1 | 6.25 | 11 | 4 | 3.13 | 29.2 | 0.50 |
| Example 2 | 6.25 | 11 | 4 | 2.52 | 29.2 | 0.40 |
| Example 3 | 6.25 | 11 | 4 | 3.45 | 29.2 | 0.55 |
| Example 4 | 5.05 | 11 | 4 | 3.13 | 28.5 | 0.62 |
| Example 5 | 8.65 | 11 | 4 | 3.13 | 28.5 | 0.36 |
| Example 6 | 6.25 | 8.6 | 3 | 3.13 | 28.4 | 0.50 |
| Example 7 | 6.25 | 12 | 4.2 | 3.13 | 28.4 | 0.50 |
| Example 8 | 6.25 | 10 | 3 | 3.13 | 25.5 | 0.50 |
| Comparative Example 1 | 6.25 | 10 | 3 | Not added | 32.3 | — |
| Comparative Example 2 | 6.25 | 11 | 4 | Not added | 29.2 | — |
| Comparative Example 3 | 6.25 | 15 | 4 | Not added | 29.2 | — |
| Comparative Example 4 | 6.25 | 10 | 4 | Not added | 29.2 | — |
| Comparative Example 5 | Not added | Not added | Not added | 15 | 30 100 ppm of W was added | — |
| Comparative Example 6 | 7.5 | 18 | 6 | 15 | 30 100 ppm of W was added | 2.0 |
| Comparative Example 7 | PGL: 40 | Not added | 4 | EUR: 7 | 35 | 0.175 |

TABLE 2

Evaluation results

| | Tensile strength(MPa) | Elongation percentage | Roughness Rz | Electrical conductivity | Thickness | Evaluation results | | |
|---|---|---|---|---|---|---|---|---|
| | *1 *2 | (%) | (μm) | (%) | (μm) | Bend | Break | Gloss |
| Exale 1 | 535 665 | 6.4 | 1.75 | 99≥ | 9 | Good | Good | Good |
| Example 2 | 512 645 | 7.7 | 1.65 | 99≥ | 8 | Excellent | Excellent | Good |
| Example 3 | 584 735 | 5.8 | 1.70 | 99≥ | 10 | Fair | Fair | Good |
| Example 4 | 545 680 | 5.5 | 1.85 | 99≥ | 9 | Fair | Good | Good |
| Example 5 | 505 630 | 11.8 | 1.95 | 99≥ | 8 | Excellent | Excellent | Good |
| Example 6 | 525 672 | 9.6 | 1.65 | 99≥ | 8 | Good | Good | Good |
| Example 7 | 550 668 | 8.8 | 1.55 | 99≥ | 9 | Fair | Good | Excellent |
| Example 8 | 515 635 | 7.8 | 2.05 | 99≥ | 8 | Good | Excellent | Fair to Good |
| C. Example 1 | 340 435 | 10.5 | 1.85 | 99≥ | 8 | Excellent | Excellent | Good |
| C. Example 2 | 345 438 | 7.5 | 1.55 | 99≥ | 8 | Excellent | Excellent | Fair to Good |
| C. Example 3 | 335 430 | 8.2 | 1.45 | 99≥ | 8 | Excellent | Excellent | Fair to Good |
| C. Example 4 | 350 455 | 7.8 | 1.60 | 99≥ | 8 | Excellent | Excellent | Good |
| C. Example 5 | 498 615 | 3.8 | 2.65 | 95≤ | 12 | Fair | Fair | Fair |
| C. Example 6 | 495 605 | 4.8 | 1.50 | 95≤ | 12 | Fair | Good | Good |
| C. Example 7 | 485 600 | 5.8 | 1.95 | 99≥ | 18 | Fair | Good | Fair to Good |

REFERENCE SIGNS LIST

1: Flat plate
2: Test piece (copper foil)
3: Bend (curl) value

The invention claimed is:

1. A method for producing an electrolytic copper foil, the method comprising:
   forming an electrolytic copper foil by passing a direct current between an insoluble anode and a cathode drum facing the insoluble anode, in the presence of a sulfuric acid-copper sulfate aqueous solution not containing a heavy metal other than a copper metal, as an electrolytic solution, between the insoluble anode and the cathode drum,
   wherein the insoluble anode has a surface of a substrate covered with at least one material selected from the group consisting of a platinum group metal and an oxide thereof,
   the electrolytic solution comprises each of following five additives from (A) to (E) in an amount described below,
   wherein the additive (D) and the additive (A) are each added so as to have a ratio (D)/(A) in a range from 0.2 to 0.7, and the additive (C) and the additive (B) are each added so as to have a ratio (C)/(B) in a range from 0.3 to 0.4,
   the additive (A), which is a water-soluble or dispersible nonionic organic compound having a molecular weight in a range from 200000 to 500000, in an amount from 5 to 15 ppm,
   the additive (B), which is a collagen peptide as a low-molecular-weight organic compound having a molecular weight in a range of 7000 or lower, in an amount from 6.5 to 15 ppm, the additive (C), which is a sulfonate salt of an active organic sulfur compound, in an amount from 2 to 10 ppm, the additive (D), which is a thiourea-based compound, in an amount from 2.5 to 15 ppm, and the additive (E), which is a chloride ion, in an amount from 5 to 30 ppm, wherein the electrolytic copper foil is configured to be a negative electrode material in a secondary battery, the formed electrolytic copper foil has a crystal orientation of (1 1 1), the formed electrolytic copper foil has a thickness in a range from 7 to 10 μm, and a tensile strength in a range of 500 MPa or more both immediately after being produced and 48 hours after being produced, wherein lowering of the tensile strength of the electrolytic copper foil after being produced is suppressed.

2. The method for producing an electrolytic copper foil according to claim 1, wherein the additive (D) and the additive (A) are each added so as to have the ratio (D)/(A) in a range from 0.3 to 0.6.

3. The method for producing an electrolytic copper foil according to claim 1, wherein the additive (A) comprises at least one material selected from the group consisting of hydroxyethyl cellulose, polyglycerin, and acetylene glycol.

4. The method for producing an electrolytic copper foil according to claim 1, wherein the additive (C) comprises sodium 3-mercapto-1-propanesulfonate or disodium bis(3-sulfopropyl)disulfide.

5. The method for producing an electrolytic copper foil according to claim 1, wherein the additive (D) is at least one material selected from the group consisting of thiourea, ethylene thiourea, N,N'-diethyl thiourea, N,N'-dibutyl thiourea, and trimethyl thiourea.

6. The method for producing an electrolytic copper foil according to claim 1, wherein the formed electrolytic copper foil has (a) an electrical conductivity in a range of 99% or more as an IACS value, (b) a surface roughness Rz in a range of 2.5 μm or less on both a front side and a rear side, and (c) an elongation percentage in a range of 5.5% or more, wherein lowering of the elongation percentage is suppressed.

7. The method for producing an electrolytic copper foil according to claim 6, wherein (b) the surface roughness Rz is in a range of 2.0 μm or less on both the front side and the rear side.

8. The method for producing an electrolytic copper foil according to claim 1, wherein the formed electrolytic copper foil has the tensile strength in a range of 630 MPa or more immediately after being produced.

* * * * *